United States Patent [19]
Zoladz, Jr.

[11] Patent Number: 5,855,268
[45] Date of Patent: Jan. 5, 1999

[54] OPTICAL SENSOR SYSTEM FOR A BILL VALIDATOR

[75] Inventor: Edward M. Zoladz, Jr., West Chester, Pa.

[73] Assignee: Mars Incorporated, McLean, Va.

[21] Appl. No.: 941,400

[22] Filed: Oct. 1, 1997

[51] Int. Cl.[6] ............................... G06K 7/00; H03F 3/68
[52] U.S. Cl. .......................................... 194/207; 330/254
[58] Field of Search ........................... 194/207; 250/205; 330/254

[56] References Cited

U.S. PATENT DOCUMENTS

| | | | |
|---|---|---|---|
| 4,406,996 | 9/1983 | Oka | ........................................ 250/205 |
| 4,628,194 | 12/1986 | Dobbins et al. . | |
| 4,651,292 | 3/1987 | Jeenicke et al. . | |
| 4,769,532 | 9/1988 | Kawakami | .............................. 250/205 |
| 4,947,441 | 8/1990 | Hara et al. . | |
| 5,027,415 | 6/1991 | Hara et al. . | |
| 5,167,313 | 12/1992 | Dobbins et al. . | |
| 5,330,041 | 7/1994 | Dobbins et al. . | |
| 5,443,144 | 8/1995 | Dobbins et al. . | |
| 5,465,821 | 11/1995 | Akioka | .................... 194/207 |
| 5,564,548 | 10/1996 | Dobbins et al. . | |
| 5,682,119 | 10/1997 | Soda | ........................ 330/254 |
| 5,709,293 | 1/1998 | Ishida et al. | ............................. 194/207 |

FOREIGN PATENT DOCUMENTS

| 0078708 | 5/1988 | United Kingdom | ................... 194/207 |
|---|---|---|---|
| 2219855 | 12/1989 | United Kingdom | ................... 194/207 |

*Primary Examiner*—F. J. Bartuska
*Assistant Examiner*—Bryan J. Jaketic
*Attorney, Agent, or Firm*—Fish & Richardson P.C.

[57] ABSTRACT

An optical sensor system for use in a currency validator is described. The system includes a controller, a plurality of light transmitters, a plurality of light receivers and a variable gain amplifier circuit connected to the receivers and to the microcontroller. The microcontroller controls the gain of the variable gain amplifier circuit. The variable gain amplifier circuit includes dual transconductance amplifiers connected together in such a manner to compensate for leakage current over a wide range of temperatures.

12 Claims, 6 Drawing Sheets

OPTICAL SENSOR SYSTEM FOR A BILL VALIDATOR

BACKGROUND

1. Technical Field

The present invention pertains to a device and technique for providing a stable optical sensor system. In particular, the invention concerns a variable gain amplifier circuit for controlling leakage current in an optical sensor system of a bill validator, and a method for obtaining light measurements.

2. Background Information

Bill validators used in vending machines and the like typically utilize optical, magnetic and other sensors to obtain measurements from an inserted bill to determine authenticity and denomination. Typically, the bill is transported past a plurality of photosensors, typically made up of light-emitting diodes (LEDs) and phototransistors, and a plurality of signals are generated corresponding to measurements taken from different areas of the bill. The LED drive signals are typically multiplexed between two or more LEDs to emit light at a number of wavelengths in a short period of time to ensure high security against fraud. The signals are then processed to validate and authenticate the bill.

Factors which may adversely affect the bill measurements include the following: the output power of an LED can degrade on the order of fifty percent with aging, inserted bills are of differing quality, and bill path cleanliness may vary. Further, some bill validator applications require undiminished performance under harsh outdoor conditions such as extreme cold or heat, and such temperature changes can cause wildly varying gain characteristics in LED-receiver pairs resulting in erroneous sensor readings. In addition, there are normal production variations in LED optical power output and receiver sensitivity, which can lead to units having varying current and voltage requirements in order to operate effectively. In order to compensate for such phenomena, optical sensor measurements were taken over a large dynamic range. However, a gain adjustment range for the amplifier circuitry of ten to one was typically used, which proved to be marginally adequate only if tightly specified and sorted optical components were utilized in the bill validator. Since performance of a bill validator must be acceptable over a wide temperature range, and LED/receiver pairs are subject to variations in performance characteristics, a system having an adjustable gain is required to ensure a robust bill validator sensor system.

SUMMARY OF THE INVENTION

The invention features an improved optical sensor system for use in a currency validator. The optical sensor system includes a microcontroller, a plurality of light transmitters, a plurality of light receivers for producing signals, and a variable gain amplifier circuit connected to the receivers and to the microcontroller. The microcontroller controls the gain of the variable gain amplifier based on predetermined measurements of each light transmitter, and the variable gain amplifier includes dual transconductance amplifiers having an input signal applied to a bias current input and having their differential inputs inversely connected together to compensate for leakage current over a wide range of temperatures.

The optical sensor system may also include one or more of the following features. A twelve-bit digital-to-analog converter may be connected between the microcontroller and the plurality of light transmitters. A memory connected to the microcontroller may be included for storing predetermined light transmitter and receiver circuit values. At least one of the light transmitters may be an optical package containing at least two LEDs, wherein each LED transmits light of a different wavelength. A twelve-bit analog-to-digital converter may be connected between the variable gain amplifier and the microcontroller, a gain digital-to-analog converter may be connected between the microcontroller and the variable gain amplifier, and a multiplexer may be connected between the receivers and the variable gain amplifier, and having an input connected to the microcontroller. A motor drive circuit may be included for controlling a transport motor and a stacker motor.

Another aspect of the invention concerns, generally, a variable gain amplifier circuit. An operational transconductance amplifier circuit has dual transconductance amplifiers having an input signal applied to a bias current input, and having their differential inputs inversely connected together.

The variable gain amplifier circuit may also include one or more of the following features. A transconductance amplifier circuit for converting a voltage signal into a current signal output, wherein the output may be connected to the bias current input of the dual transconductance amplifiers. A variable transistor may be connected to the transconductance amplifier circuit for selecting the transconductance. An overcurrent protection circuit may be connected between the transconductance amplifier and the operational transconductance amplifier circuit.

In one embodiment of the invention, a bill validator includes a variable gain amplifier with a continually adjustable gain driven by a twelve-bit gain DAC. In addition, a microprocessor uses a twelve-bit LED DAC for making LED current adjustments. The enhanced adjustability provided by this circuitry ensures adequate signal levels for reliable LED and receiver pair operation over the validator's lifetime. In addition, such a design permits using LED components with a wider distribution of characteristics, thus avoiding a costly sorting process during manufacturing to find LEDs that are within acceptable tolerance levels. The invention also provides low offsets across an extended temperature range through the use of leakage current compensation in the transconductance amplifiers of the variable gain amplifier circuitry. The result is consistent performance and security across the product's usable temperature range.

Thus, the invention provides a stable, variable gain amplifier for use with an optical sensor system. The variable gain amplifier amplifies low level, medium bandwidth sensor signals at a continuously variable range of gains while maintaining low offsets over a wide temperature range.

The details of one or more embodiments of the invention are set forth in the accompanying drawings and the description below. Other features and advantages of the invention will be apparent from the description and drawings, and from the claims.

DESCRIPTION OF THE PREFERRED EMBODIMENTS

Figure 1:
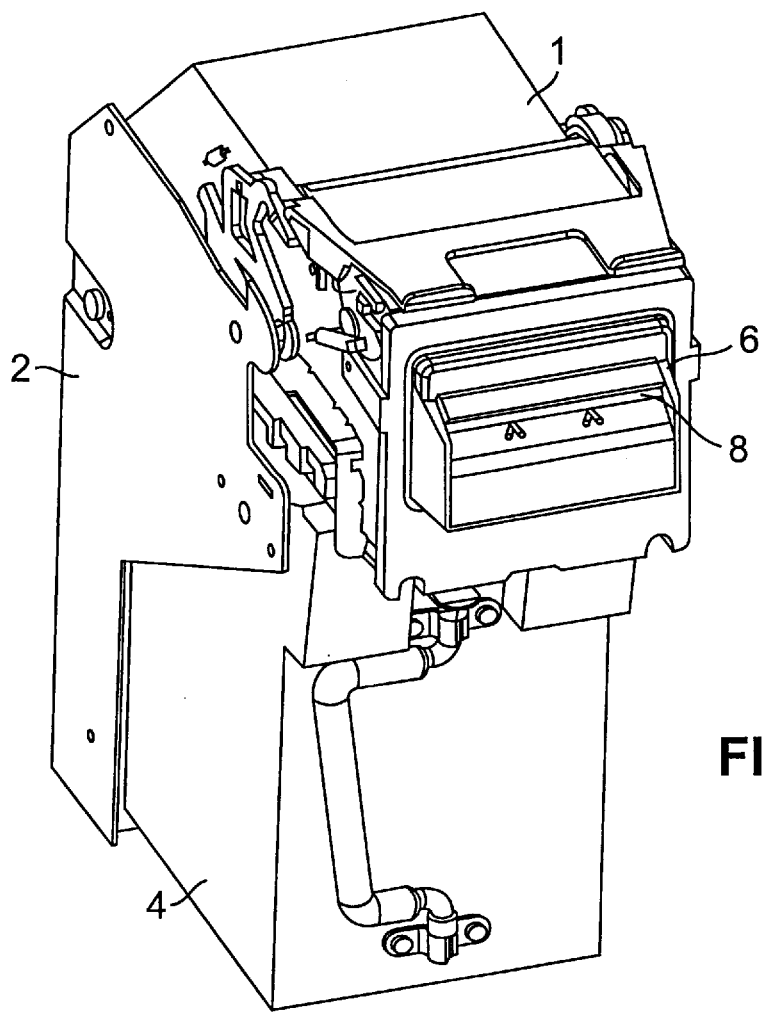
FIG. 1 is a perspective view of a currency validator and transport unit.

FIG. 1 is a perspective view of a currency validator and transport unit 1 connected to a bill stacker 2 and currency container or cashbox 4. The term currency used herein means any paper currency, bill, banknote or other security document which may be used to pay for goods or services. The bill validator and transport unit may have a bezel 6 designed to fit through an aperture in the front panel of a vending machine, gaming machine such as a slot machine, and the like. A bill entryway 8 is incorporated in the bezel for the insertion of currency.

Figure 2B:
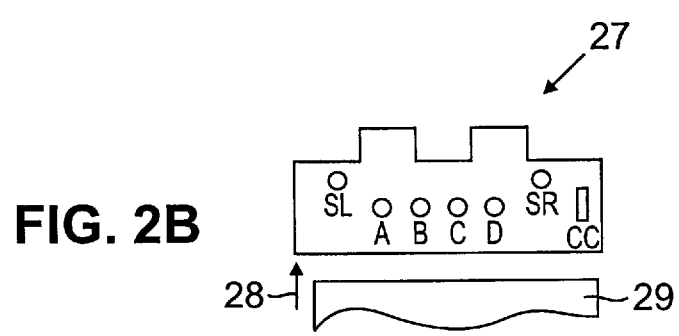
FIG. 2B is a simplified top view schematic diagram of the positions of some of LEDs in the bill validator and transport unit of FIG. 2A.
Figure 2A:
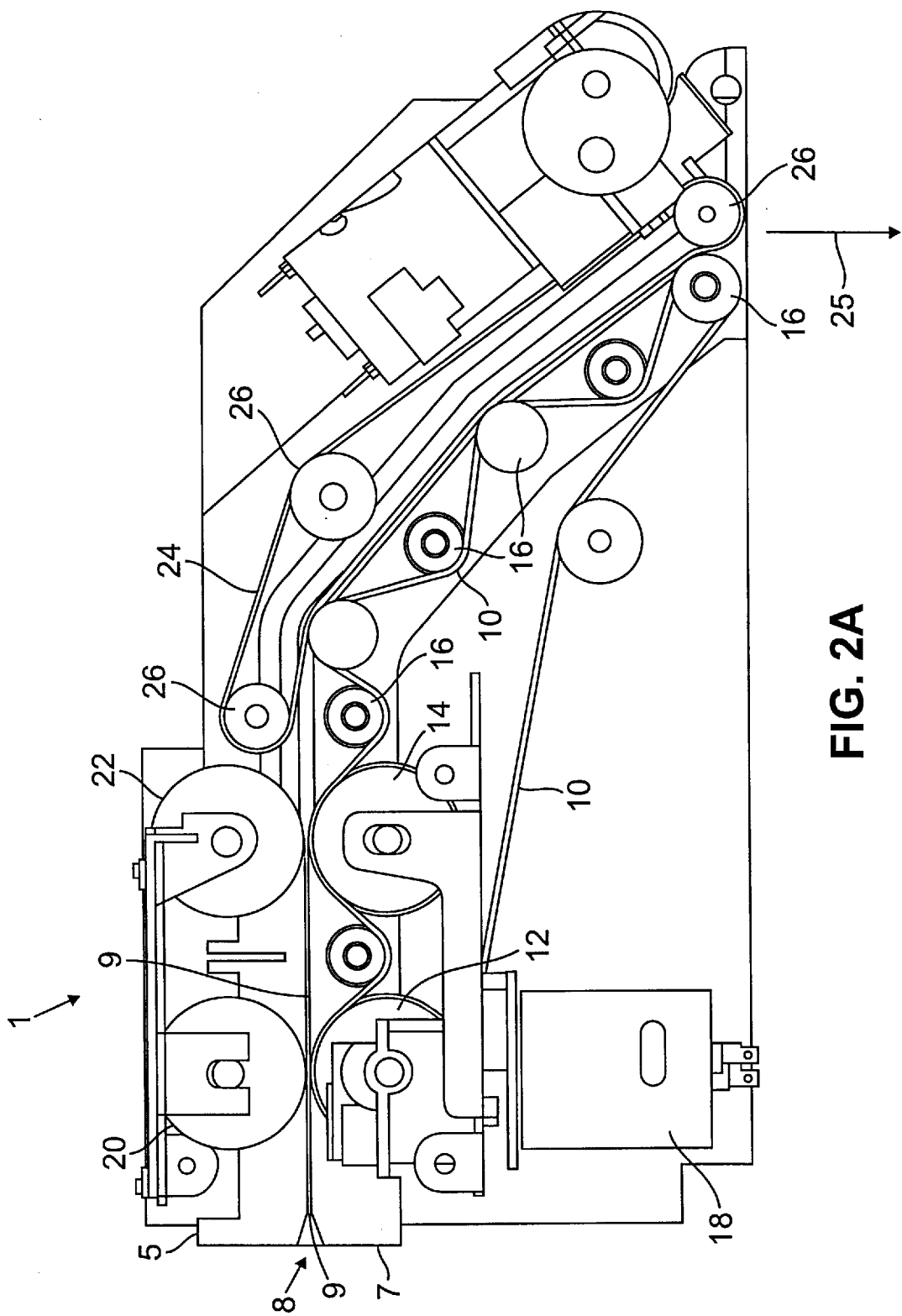
FIG. 2A is an enlarged side view of the interior of the bill validator and transport system of FIG. 1.

FIG. 2A is an enlarged side view of the interior of the bill validator and transport system 1. The bill entryway 8 leads to a bill passageway 9. The beginning of the bill passageway is defined by an upper housing 5 and a lower housing 7. Disposed on the bottom of the bill passageway is a set of continuous belts 10 (one on each side of the bill passageway) which fit through openings (not shown) in the lower housing 7 to contact a bill. The belts 10 are connected to a drive wheel 12, a pulley wheel 14 and various other tensioning wheels 16. A reversible transport motor 18 is connected via a series of gears (not shown) to the drive wheels 12. Pulley wheels 20, 22 are located on the top of the bill passageway which fit through openings in the upper housing 5 and are opposite the drive wheel and pulley wheel 14. In addition, a pair of continuous transport belts 24 are connected to tensioning wheels 26 on the top of the bill passageway.

When a banknote is inserted into the currency validator and transport unit 1, one or more sensors cause the transport motor 18 to start. The bill is gripped between the belts 10 and wheels 20 and advanced through the bill passageway 9 (from left to right in FIG. 2A) to encounter a plurality of optical and other sensors. If the information gathered by the sensors at any given point indicates that the bill is not genuine, then the transport motor 18 is reversed and the bill is rejected. Data collection continues until an escrow sensor (not shown) indicates that the bill transport should be stopped, at which time a braking signal is applied to the motor. The banknote is then validated and denominated, and the vending machine checked to see if the proper merchandise is available.

At the time the bill is stopped for validation, the bill is being gripped by the tractor belts 10 and transport belts 24 in case the motor is to be reversed and the bill rejected. Further, it is desirable to handle paper currency in a validator as quickly as possible. Therefore, accurate monitoring of banknote position in the bill passageway 9 to guarantee correct processing is critical.

When a bill is accepted, it is transported in the direction of arrow 25 to a stacker or bill pushing device (not shown) for storage in a currency cashbox. The details concerning the stacking of paper currency in a currency cashbox do not form a part of this invention, and thus are not described in detail herein. Similarly, details concerning the processing of electrical sensor signals to validate and to denominate paper currency are not part of the current invention, and will not be described in detail herein. However, various aspects of the circuitry and functioning of the optical sensors which generate the test signals used to validate and denominate currency do form a part of the invention and are further described below. Examples of techniques used by bill validators employing optical, magnetic and other sensors to validate and denominate banknotes can be found in U.S. Pat. Nos. 4,628,194; 5,167,313; 5,330,041; 5,443,144; and 5,564,548 which are assigned to the assignee of the present invention and are incorporated by reference herein.

A currency validator according to the invention contains a plurality of optical sensors located along the bill passageway 9 to generate electrical signals in response to features of a bill. FIG. 2B is a simplified top view diagram 27 of the positions of the LEDs of the front optical sensors in the embodiment of FIG. 2A. In particular, there are four optical recognition units A, B, C, D, a start left (SL) sensor, start right (SR) sensor, and a cross-channel (CC) sensor. These front optical sensors are comprised of transmitters (for example, light emitting diodes or LEDs) and receivers (such as phototransistors) positioned in the upper housing 5 and lower housing 7 on opposite sides of the bill passageway 9 near the bill entryway 8. A bill 29 would be inserted in the direction of arrow 28 to be transported between the front optical sensors. An optical escrow sensor (not shown) is also used to sense when the trailing edge of a bill has passed, and may be located in a position in the upper and lower housings in between the pulley wheels 20 and 22 (see FIG. 2A). The optical sensors used in the validator apparatus are encased in the upper and lower housings to prevent dirt and other foreign matter from adhering to the sensors, and to prevent tampering. In addition, at least one front optical sensor transmits and receives infra-red wavelength signals. Consequently, the upper and lower housings are preferably made of transparent plastic, in particular a red transparent plastic material having optical characteristics which permit the unobstructed transmission of infra-red waves.

Figure 3:
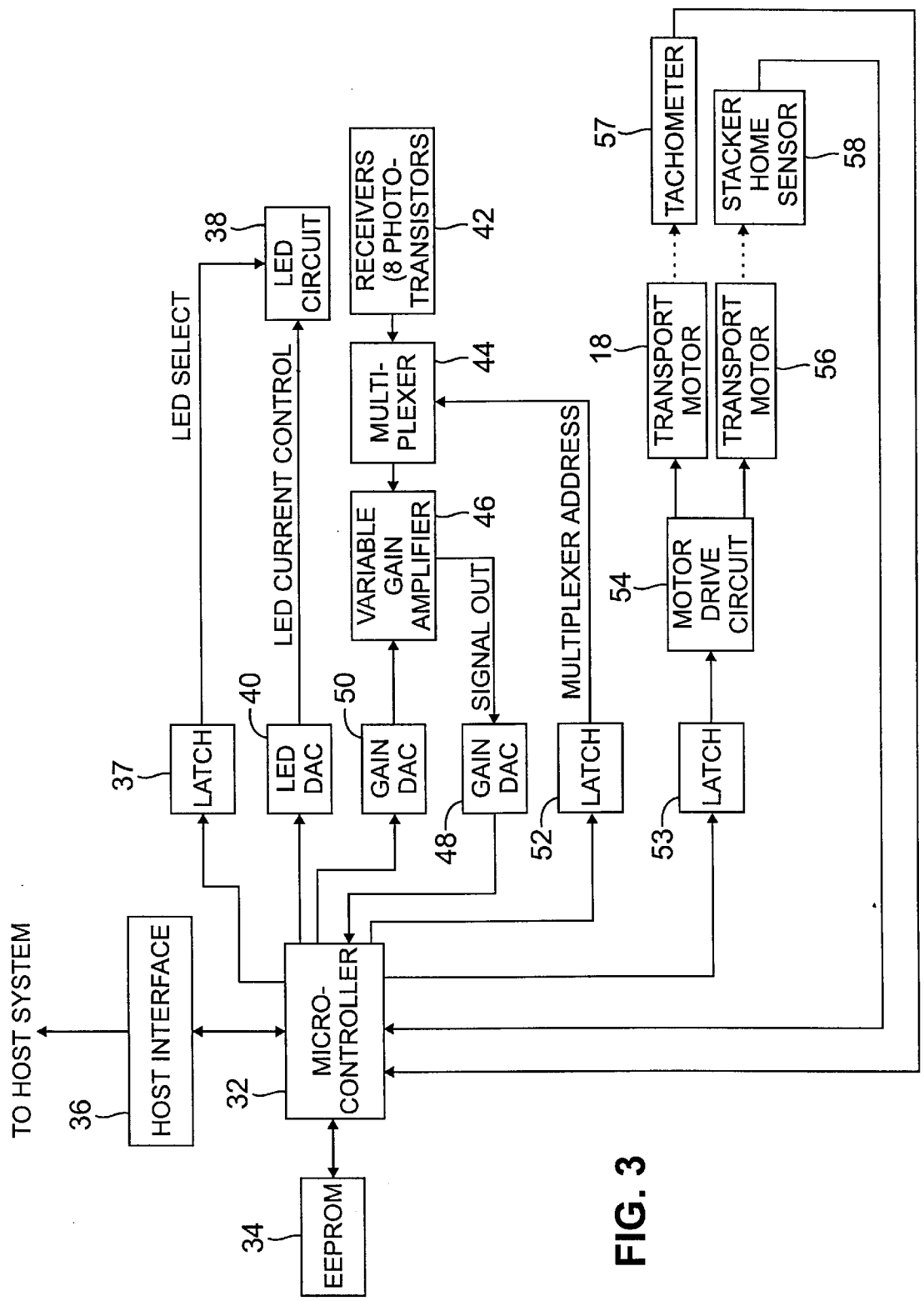
FIG. 3 is a simplified validator block diagram according to the invention.

FIG. 3 is a simplified validator block diagram. A microcontroller 32 is connected to an EEPROM 34, which stores predetermined values for use when processing signals from each of the optical transmitters (LEDs). The microcontroller performs all processing of signals to validate and denominate an inserted banknote, and transmits information such as credit data, hardware error messages, in-service and out-of-service messages and the like to the host system through host interface 36. The microcontroller controls each LED in the LED circuitry 38 through latch 37, and provides drive current through LED digital-to-analog converter (DAC) 40. When an LED is selected and energized, a corresponding receiver (one of the phototransistors in the receiver circuitry 42) generates a signal which is received by the microcontroller through multiplexer 44, variable gain amplifier 46, and a twelve-bit receiver analog-to-digital converter (ADC) 48. The microcontroller also controls the gain of the variable gain amplifier 46 through gain digital to analog converter (DAC) 50 for the particular receiver. The microcontroller selects the receiver of interest by specifying an address through latch 52 to multiplexer 44.

The microcontroller 32 is also connected to the transport motor 18 and stacker motor 56 through a latch 53 and a motor drive circuit 54. The transport motor has an associated tachometer 57 for accurately monitoring the position of a banknote in the banknote passageway 9, and the stacker motor has an associated stacker home sensor 58 for monitoring the home position of the bill stacker. The escrow sensor, tachometer 57 and stacker home sensor 58 provide accurate information regarding bill position in the device.

The LED DAC 40 and gain DAC 50 are preset to appropriate settings during calibration of the bill validator optical sensors. Calibration occurs when the validator is placed in calibration mode and white paper having transmissivity and diffusion characteristics similar to a banknote is inserted. The validator sets the gain DAC to an arbitrary number (for example, 1400 out of a full scale of 4095), and adjusts the LED DAC setting for each LED until the ADC 48 reading for that LED is equal to the arbitrary number (e.g. 1400). The setting value of the LED DAC for each LED can then be permanently stored in EEPROM 34, so that any time a given LED is turned ON its corresponding LED DAC setting is recalled and used. Alternately, the settings for the LED DAC and gain DAC can be calculated as the bill validator is used by the microcontroller.

When a banknote is inserted into the bill entryway 8 and detected by one or more of the optical sensors, the microcontroller 32 directs transport drive motor 18 to drive the banknote between the LED circuits 38 and receivers 42 to obtain measurements of the light transmitted through the banknote. Thus, measurements of the light transmission characteristics of the banknote are utilized to authenticate the bill, and these bill validation measurements are taken until the bill clears the front optical sensors.

Figure 4A:
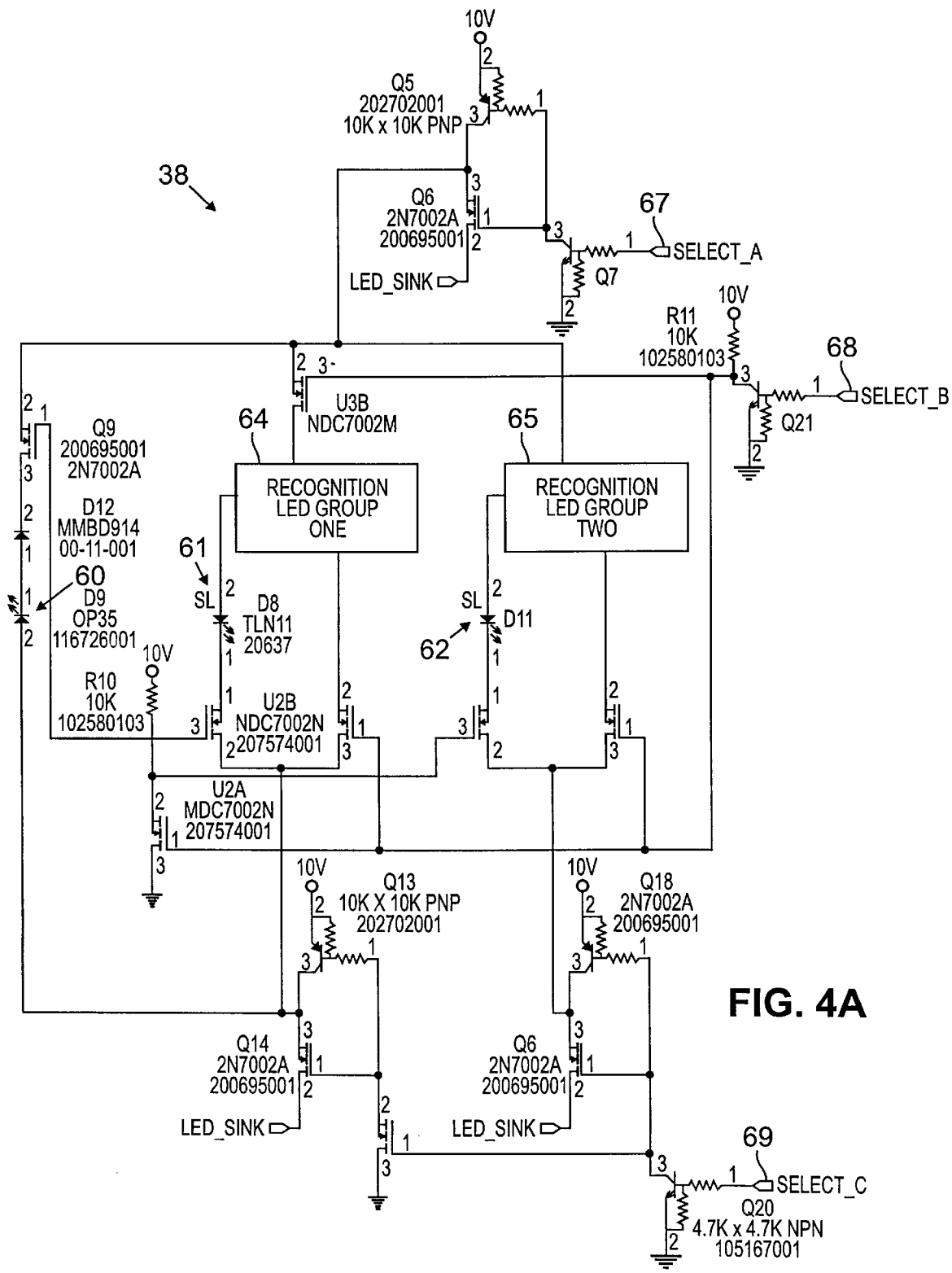
FIG. 4A is a simplified circuit diagram of an embodiment of the LED circuitry of FIG. 3.

FIG. 4A is a simplified circuit diagram of an embodiment of the LED circuitry 38. In particular, illustrated are the cross channel (CC) LED 60, the start right (SR) LED 61, the start left (SL) LED 62, and recognition LED group one 64 and recognition LED group two 65. The recognition LED groups may contain two or more LEDs, wherein each LED in a recognition group may be of a different wavelength than the other LED(S) in that group. For example, one LED in the recognition group 64 and one LED in recognition group 65 may transmit light of Xnm wavelength, while another LED in each may transmit light of Ynm wavelength. A third wavelength light of Znm could also be present. The microcontroller selects which LEDs to turn ON in which recognition unit via the select lines A, B and C respectively labelled 67, 68 and 69.

Figure 4B:
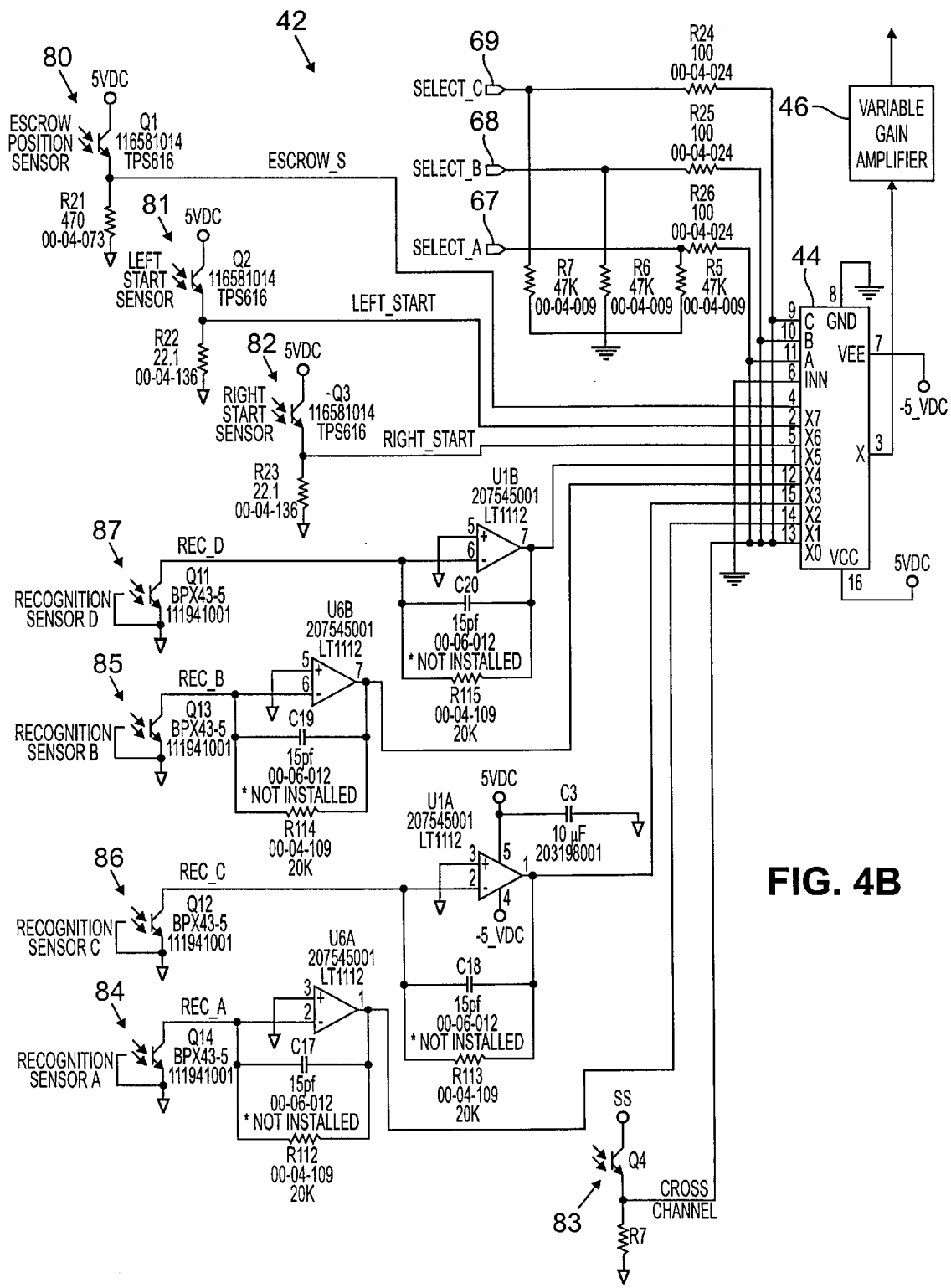
FIG. 4B is a circuit diagram of an embodiment of the receiver circuitry of FIG. 3.

FIG. 4B is a circuit diagram of the receiver circuitry 42 of FIG. 3 connected to a multiplexer 44. As shown, an escrow position phototransistor 80, a left start phototransistor 81, a right start phototransistor 82 and a cross-channel phototransistor are connected directly to the multiplexer 44. Also connected to the multiplexer through amplifier circuitry are recognition receivers A, B, C and D, or phototransistors 84, 85, 86 and 87, respectively. The microcontroller 32 selects the appropriate receiver or phototransistor by sending the select signals on select lines 67, 68 and 69. The output of the multiplexer 44 is then sent to the variable gain amplifier 46.

Figure 5:
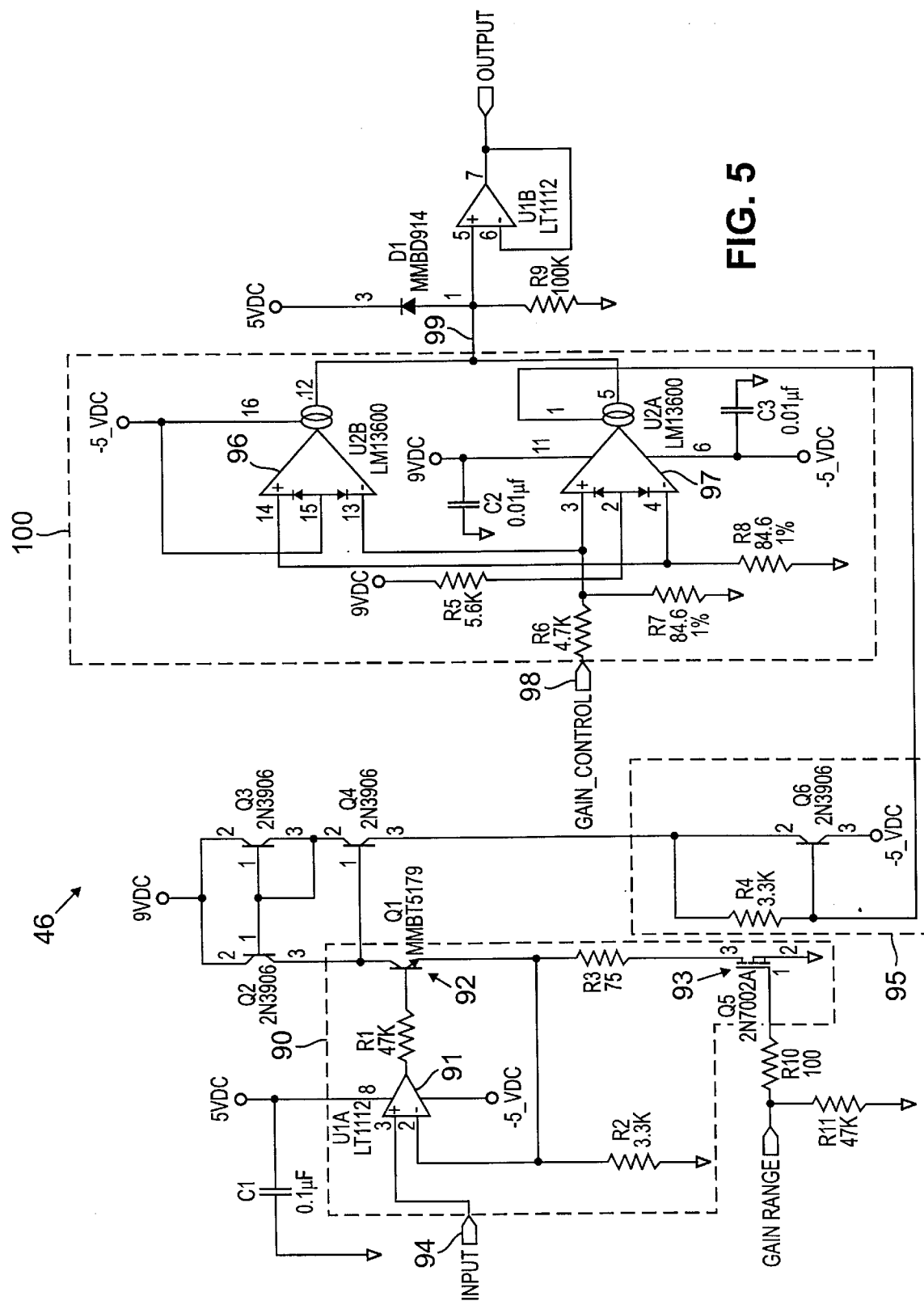
FIG. 5 is a circuit diagram of variable gain amplifier circuitry according to the invention.

FIG. 5 is a circuit diagram of the variable gain amplifier 46 of FIG. 3. A transconductance amplifier 90 is comprised of an operational amplifier 91, transistors 92 and 93 and resistors R1, R2 and R3. The transconductance amplifier 90 has a gain proportional to the input signal on line 94, and takes the input voltage from one of the receiver phototransistors chosen in multiplexer 44 and converts it to a current flowing into the collector of transistor 92. The transconductance of this stage is selectable via transistor 93 and the values of R2 and R3 to either 303 uA/V or 13.6 uA/V. R1 serves to limit the maximum current flowing through the transistor 92. The current in transistor 92 is mirrored by transistors Q2–Q4 so that the current flowing out of the collector of Q4 is roughly equal to the current flowing into the collector of the transistor 92. The combination of Q6 and R4 form an overcurrent protect circuit 95 for the bias current input (pin 1) of U2A.

An operational transconductance amplifier circuit 100 is formed of dual transconductance amplifiers U2A 96 and U2B 97, and functions as a variable gain block. The gain is controlled by a 0–4 volt signal applied at the gain control input line 98 at resistor R6. The operational transconductance amplifier comprising amplifiers 96 and 97 (such as an LM13600 manufactured by National Semiconductor of California) has linearizing diodes that are used to convert the voltage across R6 into a linear bias for the differential inputs of U2A 96 and U2B 97. The input signal is fed (as a current) into the bias current input (pin 1) of U2A. This input is conventionally used as a gain control input in operational transconductance amplifiers, with the amplified signal fed to the differential inputs. However, by applying the input signal to the bias current input much lower offsets are achieved, with the prime source of offsets being leakage currents in the current mirror at the bias current input rather than poor transistor matching in the input differential pair.

The maximum bias current leakage specification for the LM13600 is 100 nA at a temperature of 25° C., which would result in a 10 mV offset across resistor R9. This offset increases by about a decade for every 40° C., so if the transconductance amplifiers U2A and U2B (96 and 97) were connected in a conventional manner, at a temperature of 65° C. the offset could grow to an objectionable 100 mV. To compensate for these temperature induced offsets, the differential inputs of U2B 96 are inversely connected to the differential inputs of U2A 97 as shown in FIG. 6, such that the gain of U2B is −1 times the gain of U2A. The bias current input of U2B is connected to a −5V source, so that the only current flowing into the output (pin 12) is due to leakage current. This output pin is tied to the output of U2A (pin 5) such that the leakage current contribution of the signal current flowing out of pin 5 is compensated by the leakage current signal flowing into pin 12. In this manner offsets are compensated across a very wide range of temperatures to provide a stable variable gain amplifier circuit. The voltage at the output 99 of the transconductance amplifier circuit 100 is limited by diode D1 and buffered by operational amplifier U1B, which acts as a typical voltage follower.

A number of embodiments of the present invention have been described. Nevertheless, it will be understood that various modifications may be made without departing from the spirit and scope of the invention. Accordingly, other embodiments are within the scope of the following claims.

What is claimed is:

1. An optical sensor system for use in a currency validator, comprising:
   a microcontroller;
   a plurality of light transmitters connected to the microcontroller;
   a plurality of light receivers connected to the microcontroller for producing signals; and
   a variable gain amplifier circuit connected to the receivers and to the microcontroller, wherein the microcontroller controls the gain of each light transmitter, and wherein the variable gain amplifier includes dual transconductance amplifiers having an input signal applied to a bias current input and having their differential inputs inversely connected together to compensate for leakage current over a wide range of temperatures.

2. The optical sensor system of claim 1, further comprising a twelve-bit digital-to-analog converter connected between the microcontroller and the plurality of light transmitters.

3. The optical sensor system of claim 1, further comprising a memory connected to the microcontroller for storing light transmitter and receiver circuit values.

4. The optical sensor system of claim 1, wherein at least one of the light transmitters is an optical package containing at least two LEDs, wherein each LED transmits light of a different wavelength.

5. The optical sensor system of claim 1, further comprising a twelve-bit analog-to-digital converter connected between the variable gain amplifier and the microcontroller.

6. The optical sensor system of claim 1, further comprising a gain digital-to-analog converter connected between the microcontroller and the variable gain amplifier.

7. The optical sensor system of claim 1, further comprising a multiplexer connected between the receivers and the variable gain amplifier, and having an input connected to the microcontroller.

8. The optical sensor system of claim 1, further comprising a motor drive circuit for controlling a transport motor and a stacker motor.

9. A variable gain amplifier circuit, comprising:

an operational transconductance amplifier circuit having dual transconductance amplifiers having an input signal applied to a bias current input and having their differential inputs inversely connected together to compensate for leakage current over a wide range of temperatures.

10. The variable gain amplifier circuit of claim 9, further comprising a transconductance amplifier circuit for converting a voltage signal input into a current signal output, wherein the output is connected to the bias current input of the dual transconductance amplifiers.

11. The variable gain amplifier circuit of claim 10, further comprising a variable transistor connected to the transconductance amplifier circuit for selecting the transconductance.

12. The variable gain amplifier circuit of claim 10, further comprising an overcurrent protection circuit connected between the transconductance amplifier and the operational transconductance amplifier circuit.

* * * * *

UNITED STATES PATENT AND TRADEMARK OFFICE
CERTIFICATE OF CORRECTION

PATENT NO. : 5,855,268
DATED : January 5, 1999
INVENTOR(S) : Edward M. Zoladz, Jr.

It is certified that error appears in the above-identified patent and that said Letters Patent is hereby corrected as shown below:

Col. 5, line 58, cancel "13.6 µA/V" and insert --13.6 pmA/V--.

Abstract, line 2, cancel "controller" and insert --microcontroller--.

Signed and Sealed this

Seventeenth Day of August, 1999

Q. TODD DICKINSON

*Attest:*

*Attesting Officer*    Acting Commissioner of Patents and Trademarks